(12) United States Patent
Kersaudy-Kerhoas et al.

(10) Patent No.: US 11,760,625 B2
(45) Date of Patent: Sep. 19, 2023

(54) MICROFLUIDIC MIXING

(71) Applicant: Heriot-Watt University, Edinburgh (GB)

(72) Inventors: Maiwenn Kersaudy-Kerhoas, Edinburgh (GB); Antonio Liga, Edinburgh (GB)

(73) Assignee: HERIOT-WATT UNIVERSITY, Edinburgh (GB)

( * ) Notice: Subject to any disclaimer, the term of this patent is extended or adjusted under 35 U.S.C. 154(b) by 677 days.

(21) Appl. No.: 16/613,269

(22) PCT Filed: May 23, 2018

(86) PCT No.: PCT/GB2018/051412
§ 371 (c)(1),
(2) Date: Nov. 13, 2019

(87) PCT Pub. No.: WO2018/215777
PCT Pub. Date: Nov. 29, 2018

(65) Prior Publication Data
US 2020/0140260 A1    May 7, 2020

(30) Foreign Application Priority Data

May 24, 2017 (GB) ..................................... 1708319

(51) Int. Cl.
*B81B 5/00* (2006.01)
*F16K 99/00* (2006.01)
(Continued)

(52) U.S. Cl.
CPC ............ *B81B 5/00* (2013.01); *F16K 99/0001* (2013.01); *G01N 35/1072* (2013.01);
(Continued)

(58) Field of Classification Search
CPC ........................ B81B 2201/051; B01L 3/5027
See application file for complete search history.

(56) References Cited

U.S. PATENT DOCUMENTS 6,186,659 B1    2/2001  Schembri
6,706,519 B1    3/2004  Kellogg et al.
(Continued)

FOREIGN PATENT DOCUMENTS

CN        201596477 U    10/2010
CN        104984773 A    10/2015
(Continued)

OTHER PUBLICATIONS

Intellectual Property Office, Great Britain Search Report for European Patent Application No. 1708319.7, dated Nov. 21, 2017, (5 pages), South Wales, United Kingdom.
(Continued)

*Primary Examiner* — Moazzam Hossain
(74) *Attorney, Agent, or Firm* — Alston & Bird LLP

(57) ABSTRACT

A microfluidic device (100) for mixing a liquid L is provided. The microfluidic device (100) comprises a microfluidic chamber (20), having an inlet (30), and arranged to receive the liquid L therein. In use, the microfluidic device (100) is arranged to control translation through the liquid L of a body B introduced therein, wherein the translation of the body B is due to a potential field acting on the body. In this way, the controlled translation of the body B mixes the liquid L in the microfluidic chamber (20).

13 Claims, 9 Drawing Sheets

(51) Int. Cl.
*G01N 35/10* (2006.01)
*G05D 7/06* (2006.01)

(52) U.S. Cl.
CPC ...... *G05D 7/0694* (2013.01); *B81B 2201/051* (2013.01); *B81B 2207/99* (2013.01)

(56) References Cited

U.S. PATENT DOCUMENTS

| | | | |
|---|---|---|---|
| 2003/0196714 A1* | 10/2003 | Gilbert | B01L 3/502761 137/828 |
| 2005/0277187 A1 | 12/2005 | Johnson et al. | |
| 2006/0028908 A1 | 2/2006 | Suriadi et al. | |
| 2008/0069729 A1 | 3/2008 | McNeely | |
| 2010/0279899 A1* | 11/2010 | Fulwyler | B01L 3/502784 506/30 |
| 2013/0183209 A1* | 7/2013 | Richter | B01L 3/502784 422/403 |
| 2014/0378348 A1* | 12/2014 | Makarewicz, Jr. | C12Q 1/6806 506/40 |

FOREIGN PATENT DOCUMENTS

| | | |
|---|---|---|
| DE | 102013220264 A1 | 4/2015 |
| EP | 1970565 A1 | 9/2008 |
| EP | 1975618 B1 | 10/2011 |
| EP | 2426497 A1 | 3/2012 |
| WO | WO-2001/043871 A2 | 6/2001 |
| WO | WO-2007/098027 A2 | 8/2007 |
| WO | WO-2011/114113 A1 | 9/2011 |
| WO | WO-2015/051950 A1 | 4/2015 |
| WO | WO-2015/132743 A1 | 9/2015 |

OTHER PUBLICATIONS

Intellectual Property Office, Great Britain Search Report for European Patent Application No. 1708319.7, dated Apr. 5, 2018, (3 pages), South Wales, United Kingdom.
International Searching Authority, International Search Report and Written Opinion for International Application No. PCT/GB2018/051412, dated Oct. 29, 2018, (6 pages), Rijswijk, The Netherlands.

* cited by examiner

MICROFLUIDIC MIXING

CROSS REFERENCE TO RELATED APPLICATIONS

This application is a National Stage Application, filed under 35 U.S.C. 371, of International Application No. PCT/GB2018/051412, filed May 23, 2018, which international application claims priority to Great Britain Application No. 1708319.7, filed May 24, 2017; the contents of both of which as are hereby incorporated by reference in their entireties.

BACKGROUND

Related Field

The present invention relates to a microfluidic mixing of a liquid, for example by controlled translation of a body therein.

Description of Related Art

Microfluidics typically relates to behaviour, control and/or manipulation of fluids that are geometrically constrained to small, typically sub-millimeter, scales, such as microscales from about 100 nm to about 500 µm. Microfluidic behaviour may differ from macrofluidic behaviour since effects due to surface tension, energy dissipation and/or fluidic resistance, which may be negligible in macrofluidics, may instead tend to predominate in microfluidics. For example, the Reynolds number of the fluid may decrease significantly at the microscale. Thus, flow of the fluid may be laminar at the microscale, rather than turbulent as at the macroscale. Hence, co-flowing fluids in continuous-flow microfluidics may not mix effectively at the microscale, due to this laminar, rather than turbulent, flow. Instead, mixing of the co-flowing fluids may be by diffusional molecular transport. Such diffusional mixing may tend to reduce mixing efficiency while increasing mixing timescales, by up to orders of magnitude.

Known methods of improving mixing of fluids at the microscale may employ passive microfluidic techniques, for example using capillary forces, or active microfluidic techniques, for example using micropumps or microvalves. However, such known passive microfluidic techniques may still be relatively inefficient and/or associated with relatively long mixing timescales, while having limited application flexibility, for example. Conversely, such known active microfluidic techniques may increase complexity and/or cost, while having reduced fluid compatibility, for example.

Hence, there is a need to improve microfluidic mixing.

BRIEF SUMMARY

It is one aim of the present invention, amongst others, to provide microfluidic mixing which at least partially obviates or mitigates at least some of the disadvantages of the prior art, whether identified herein or elsewhere. For instance, it is an aim of embodiments of the invention to provide a process of microfluidic mixing that may increase a mixing efficiency and/or reduce mixing timescale. For instance, it is an aim of embodiments of the invention to provide a microfluidic device having reduced complexity and/or increased application flexibility.

A first aspect of the invention provides use of controlled translation of a body for mixing of a liquid in a microfluidic device, wherein the translation of the body through the liquid is due to a potential field acting on the body.

A second aspect of the invention provides use of controlled translation of a gas bubble to coalesce a first liquid portion with an adjacent second liquid portion in a microfluidic device.

A third aspect of the invention provides a process of mixing a liquid by controlling translation of a body therethrough, comprising:
receiving a liquid in a microfluidic chamber;
introducing a body into the liquid; and
controlling translation of the body through the liquid, wherein the translation of the body is due to a potential field acting on the body;
whereby the controlled translation of the body mixes the liquid.

A fourth aspect of the invention provides a microfluidic device comprising a microfluidic chamber, having an inlet, and arranged to receive a liquid therein;
wherein, in use, the microfluidic device is arranged to control translation through the liquid of a body introduced therein, wherein the translation of the body is due to a potential field acting on the body;
whereby the controlled translation of the body mixes the liquid.

A fifth aspect of the invention provides a microfluidic cartridge comprising a microfluidic device according to the fourth aspect.

A sixth aspect of the invention provides an apparatus arranged to control a microfluidic device according to the fourth aspect or a microfluidic cartridge according to the fifth aspect.

A seventh aspect of the invention provides a microfluidic system comprising an apparatus according to the sixth aspect and a microfluidic device according to the fourth aspect or a microfluidic cartridge according to the fifth aspect.

A eighth aspect of the invention provides a method of operating a microfluidic system according to the seventh aspect.

According to the present invention there is provided use of controlled translation of a body for mixing of a liquid in a microfluidic device, as set forth in the appended claims. Also provided is use of controlled translation of a gas bubble to coalesce a first liquid portion with an adjacent second liquid portion in a microfluidic device. Further provided is a process of mixing a liquid by controlling translation of a body therethrough. Additionally provided is a microfluidic device. Other features of the invention will be apparent from the dependent claims, and the description that follows.

Throughout this specification, the term "comprising" or "comprises" means including the component(s) specified but not to the exclusion of the presence of other components. The term "consisting essentially of" or "consists essentially of" means including the components specified but excluding other components except for materials present as impurities, unavoidable materials present as a result of processes used to provide the components, and components added for a purpose other than achieving the technical effect of the invention, such as colourants, and the like.

The term "consisting of" or "consists of" means including the components specified but excluding other components.

Whenever appropriate, depending upon the context, the use of the term "comprises" or "comprising" may also be taken to include the meaning "consists essentially of" or "consisting essentially of", and also may also be taken to include the meaning "consists of" or "consisting of".

Throughout this specification, the term "liquid" may be taken to refer to all of the liquid or a part thereof.

The optional features set out herein may be used either individually or in combination with each other where appropriate and particularly in the combinations as set out in the accompanying claims. The optional features for each aspect or exemplary embodiment of the invention, as set out herein are also applicable to all other aspects or exemplary embodiments of the invention, where appropriate. In other words, the skilled person reading this specification should consider the optional features for each aspect or exemplary embodiment of the invention as interchangeable and combinable between different aspects and exemplary embodiments.

The first aspect of the invention provides use of controlled translation of a body for mixing of a liquid in a microfluidic device, wherein the translation of the body through the liquid is due to a potential field acting on the body.

Typically, bodies such as free bodies in microfluidic devices are problematic, restricting and/or impeding translation or flow of the liquid. For example, a gas pocket in a channel of the microfluidic device may prevent flow of the liquid, for example, due to compressibility of the gas pocket. Additionally and/or alternatively, the gas pocket may separate adjacent portions of the liquid, inhibiting mixing between the adjacent portions of the liquid. Additionally and/or alternatively, a free solid body may become trapped, thereby forming a partial blockage or a blockage in the channel. Additionally and/or alternatively, the body and/or translation of the body may affect sensors coupled to the microfluidic device, thereby disrupting sensed measurements. Hence, bodies in microfluidic devices are generally undesirable.

Contrary to conventional practice, the inventors have found that the controlled translation of the body through the liquid is effective in mixing the liquid, while not resulting in the problems typically associated with free bodies. Without wishing to be bound by any theory, the controlled translation of the body may promote turbulence in the liquid, thereby promoting mixing of the liquid. Additionally and/or alternatively and without wishing to be bound by any theory, the controlled translation of the body may disrupt lamellar flow of the liquid and/or promote turbulent flow of the liquid, thereby promoting mixing of the liquid.

It should be understood that the liquid may comprise one or more liquid components, for example a plurality of liquid components. Two or more of this plurality of liquid components may be different. The liquid may comprise a first liquid component, for example, a solvent, a solution or a reagent. The liquid may comprise a second liquid component, for example, a biological sample and/or a biological liquid (also known as biological fluid or bodily fluid) such as blood, blood plasma, saliva, urine, amniotic fluid, cerebrospinal fluid, pleural fluid, aqueous humour, synovial fluid or semen. In this way, use of the controlled translation of the body mixes the liquid, for example, mixes the plurality of liquid components, thereby increasing a homogeneity of the liquid and/or enhancing a reaction between one or more of the plurality of liquid components.

One or more of the plurality of liquid components may be miscible or substantially miscible with the other liquid components of the plurality of liquid components. Mixing of such miscible or substantially miscible liquid components may tend to form a solution, for example. Additionally and/or alternatively, one or more of the liquid components may be immiscible or substantially immiscible with the other liquid components of the plurality of liquid components. Mixing of such immiscible or substantially immiscible liquid components may form an emulsion, for example.

The liquid may be static or substantially static. That is, the liquid may not flow during mixing. Alternatively, the liquid may be dynamic. That is, the liquid may flow during mixing. For example, where the liquid comprises a plurality of liquid components, the liquid may comprise a plurality of co-flowing liquids, such as during continuous flow microfluidics.

It should be understood that the body is a free body, translating through the liquid due to the potential field acting on the body. That is, the body is partially or wholly within the liquid, for example, partially or wholly surrounded by the liquid. That is, the body is not coupled, for example, to the microfluidic device. For example, the body is not mechanically coupled to the microfluidic device.

The body may comprise a solid, a liquid and/or a gas. For example, the body may comprise a particle, a droplet and/or a bubble. For example, the body may comprise a particle of a solid, such as a hollow body or a solid body. For example, the body may comprise a droplet of an immiscible liquid. For example, the body may comprise a gas bubble. In an example embodiment, the body is a gas bubble.

The body may be chemically and/or biologically inert. That is, the body may be compatible with biological samples, for example. Alternatively, the body may be chemically and/or biologically active and/or reactive. For example, the body may react with biological samples. For example, the body may comprise a catalyst. In an example embodiment, the body is a gas bubble, wherein the gas comprises nitrogen. For example, the gas bubble may be an air bubble.

The body may have a density different from or equal to a density of the liquid and/or a density of a liquid component of the liquid. For example, the body may have a density greater than, less than, substantially equal to or equal to the density of the liquid and/or a density of a liquid component of the liquid. For example, the body may be positively buoyant, negatively buoyant or neutrally buoyant in the liquid. For example, if the body is positively buoyant, the body may tend to ascend in the liquid. For example, if the body is negatively buoyant, the body may tend to descend in the liquid. For example, if the body is neutrally buoyant, the body may tend to neither ascend nor descend in the liquid.

The potential field acting on the body may comprise a gravitational potential field, an electrical potential field and/or a magnetic potential field. Typically, effects due to the gravitational potential field of the Earth, for example, are negligible in microfluidics due to dominance of other microscale-related effects. For example, if the potential field acting on the body comprises the gravitational potential field, the translation of the body through the liquid may be due in part to a difference between the density of the body and the density of the liquid. For example, if the potential field acting on the body comprises the electrical potential field, the translation of the body through the liquid may be due in part to an electrical charge of the body. That is, the body may comprise the electrical charge. For example, if the potential field acting on the body comprises the magnetic potential field, the translation of the body through the liquid may be due in part to a magnetism of the body. For example, the body may comprise a ferromagnetic, ferrimagnetic, paramagnetic or diamagnetic part. In an example embodiment, the potential field acting on the body is the gravitational potential field.

The translation of the body is through the liquid. That is, due to the translation of the body through the liquid, the body is displaced by a displacement d. The displacement d may be on a scale of a dimension of the body. For example, if the body has a diameter or width of D, the displacement d of the body may be D, 10D, 100D, 1000D, or more. For example, a gross displacement and a net displacement of the body may be non-zero. Alternatively, the net displacement of the body may be zero while the gross displacement of the body may be non-zero, if the translation of the body is in a circular path or if the translation of the body is reciprocal, for example. That is, a mean speed of the body may be non-zero while a mean velocity of the body may be zero. For example, the body may move though the liquid with a constant or non-constant non-zero speed or velocity. That is, a component of the velocity of the body may be non-zero. For example, the body may move though the liquid linearly or non-linearly. The translation of the body may comprise an oscillation or vibration such as cyclic contraction and expansion of the body, in addition to the displacement.

The microfluidic device may comprise a microfluidic channel or a chamber containing the liquid therein, the channel or the chamber having a dimension such as diameter or width of less than 3000 μm, less than 2000 μm, less than 1000 μm, less than 500 μm, less than 250 μm or less than 100 μm. A dimension of the body may be less than a dimension of the microfluidic device. For example, the diameter D of the body may be less than an internal diameter or bore of the microfluidic device. For example, a maximum dimension of the body may be less than a minimum dimension of the microfluidic device. For example, a ratio of the maximum dimension of the body to the minimum dimension of the microfluidic device may be at least 1:2, at least 1:3, at least 1:4, at least 1:5, at least 1:10, at least 1:20 or at least 1:50

The translation of the body through the liquid is controlled. Control of the translation of the body may be passive and/or active. Control of the translation of the body may be due at least in part to the potential field acting on the body. For example, the potential field acting on the body may be controlled, thereby in turn controlling the translation of the body through the liquid. For example, the electric potential field or the magnetic potential field may be applied, thereby applying an electrically induced force or a magnetically induced force respectively on the body. The electric potential field or the magnetic potential field may be varied, for example increased or decreased, thereby varying the electrically induced force or the magnetically induced force respectively on the body. Control of the translation of the body may be due at least in part to an interaction between the body and the microfluidic device. For example, the body may interact with a surface of the microfluidic device. For example, an attractive interaction such as due to friction between the body and the surface of the microfluidic device may counter the translation of the body, such as slowing the speed of the translation of the body. For example, such attractive interaction opposes, at least in part, the potential field acting on the body. For example, the friction between the body and the inner surface of the microfluidic chamber may oppose, at least in part, the gravitational potential field such that the translation of the body may not accelerate continuously due to the gravitational potential field. For example, the translation of the body through the liquid may be thus at a substantially constant speed in the gravitational potential field. Control of the translation of the body through the liquid may be due at least in part to an interaction between the body and the liquid. Control of the translation of the body through the liquid may be due at least in part to the liquid. For example, a viscosity of the liquid may control the translation of the body therethrough. In an example embodiment, the translation of the body through the liquid is controlled at least in part by the interaction between the body and the microfluidic device.

In an example embodiment, the body is a gas bubble. Typically, gas bubbles are particularly problematic in microfluidic devices and thus usually, efforts are made to avoid or remove the gas bubbles. Contrary to conventional practice, the inventors have found that the controlled translation of the gas bubble through the liquid is effective in mixing the liquid.

In an example embodiment, the first aspect comprises a plurality of such bodies.

In an example embodiment, the use comprises the controlled translation of the gas bubble for mixing of the liquid in the microfluidic device, wherein the translation of the gas bubble through the liquid is due to the gravitational potential field acting on the gas bubble, wherein the translation of the gas bubble through the liquid is controlled at least in part by the interaction between the gas bubble and the microfluidic device. The density of the gas bubble is less than the density of the liquid such that the gas bubble is positively buoyant in the liquid. Hence, the gas bubble tends to ascend in the liquid. Acceleration of the gas bubble during such ascension may be opposed by the interaction between the gas bubble and the surface of the microfluidic device. For example, the ascension of the gas bubble may be at a substantially constant speed for at least a part of the translation.

The second aspect of the invention provides use of controlled translation of a gas bubble to coalesce a first liquid portion with an adjacent second liquid portion in a microfluidic device.

For example, the first liquid portion and the second liquid portion may be initially separated by a gas pocket or volume, for example, contained within the microfluidic device, for example a microfluidic channel. The first liquid portion may be, for example, contained within a syringe connected to the microfluidic channel, or contained in a first chamber or in any arrangement of channels and chambers connected to the microfluidic channel. The second liquid portion may be contained in a second chamber, connected to the microfluidic channel. As the first liquid portion is pushed through the microfluidic channel, the gas pocket contained therein is forced towards the second chamber. Due to a geometry of an inlet of the second chamber and/or physical properties of liquid, gas and walls of the second chamber, the gas pocket entering the second chamber may generate gas bubbles which may ascend, in a manner controlled by a geometry of the second chamber, while the second liquid portion remains within the second chamber. Once the gas is removed and the microfluidic channel is filled with the first liquid portion, the first liquid portion and the second liquid coalesce.

The third aspect of the invention provides a process of mixing a liquid by controlling translation of a body therethrough, comprising:

receiving a liquid in a microfluidic device;

introducing a body into the liquid; and controlling translation of the body through the liquid, wherein the translation of the body is due to a potential field acting on the body;

whereby the controlled translation of the body mixes the liquid.

Features of the third aspect, for example the liquid, the controlled translation, the body, the microfluidic chamber and/or the potential field, may be as described with respect to the first aspect.

Receiving the liquid in the microfluidic device may comprise receiving the liquid in the microfluidic device via an inlet of the microfluidic device. Receiving the liquid in the microfluidic device may comprise receiving the liquid in the microfluidic device into a channel or a chamber of the microfluidic device. Receiving the liquid in the microfluidic device may comprise dispensing, flowing, pouring, injecting and/or pumping the liquid into the microfluidic device. Receiving the liquid in the microfluidic device may comprise receiving a first liquid component, or part thereof, of the liquid in the microfluidic device and subsequently, receiving a second (or at least one further) liquid component, or part thereof, of the liquid in the microfluidic device. For example, a reagent may be dispensed into the microfluidic device and subsequently, a biological sample may be pumped into the reagent previously received in the microfluidic device. For example, the reagent and the biological sample may co-flow into the microfluidic device. The first liquid component and the second liquid component may be received via the same inlet or via different inlets of the microfluidic device, for example, via a first inlet and a second inlet respectively. The first liquid component and the second liquid component may be received at the same flow rates or at different flow rates, for example a first flow rate and a second flow rate respectively. The first liquid component and the second liquid component may be received at the same volumes or at different volumes, for example a first volume and a second volume respectively. Liquid pockets for part of the liquid components might be introduced within the microfluidic device during manufacturing.

Introducing the body into the liquid may comprise receiving the liquid in the microfluidic device in the microfluidic device and subsequently, receiving the body in the microfluidic device. That is, the body may be added to the liquid, for example, immersed into the liquid or formed in the liquid. For example, the liquid may be received into the microfluidic device and subsequently, a gas bubble may be generated in the liquid. Alternatively, introducing the body into the liquid may comprise receiving the body in the microfluidic device and subsequently, receiving the liquid, or part thereof, in the microfluidic device. For example, if the body comprises a solid, the solid body may be inserted into the microfluidic device and the liquid subsequently pumped into the microfluidic device.

Controlling the translation of the body through the liquid, wherein the translation of the body is due to the potential field acting on the body, may comprise controlling the potential field acting on the body. For example, a strength and/or direction of the potential field may be controlled. Controlling the translation of the body through the liquid may be static or dynamic. For example, if the body is a gas bubble and the potential field comprises the gravitational potential field, controlling the translation of the gas bubble through the liquid may comprise controlling an angle of inclination a of the microfluidic device whereby an interaction between the gas bubble and a surface of the microfluidic device controls a rate of ascent of the gas bubble through the liquid. For example, controlling the angle of inclination a of the microfluidic device may be static, for example the angle of inclination a of the microfluidic device may be predetermined or fixed during use, such that the translation of the gas bubble is substantially at a constant speed or velocity. Alternatively, controlling the angle of inclination a of the microfluidic device may be dynamic, for example the angle of inclination a of the microfluidic device may be changed during use, such that the translation of the gas bubble may accelerate or decelerate.

In this way, the liquid may be effectively mixed.

The fourth aspect of the invention provides a microfluidic device comprising a microfluidic chamber, having an inlet, and arranged to receive a liquid therein;

wherein, in use, the microfluidic device is arranged to control translation through the liquid of a body introduced therein, wherein the translation of the body is due to a potential field acting on the body;

whereby the controlled translation of the body mixes the liquid.

Features of the fourth aspect, for example the liquid, the controlled translation, the body, the microfluidic chamber and/or the potential field, may be as described with respect to the first aspect and/or the third aspect.

The inlet may comprise a perforation or passageway through a wall of the microfluidic chamber. The inlet may comprise a liquid inlet. For example, the liquid may be received into the microfluidic chamber via the inlet. The inlet may comprise a body inlet. For example, the body may be introduced into the microfluidic chamber via the inlet. In an example embodiment, the body is a gas bubble and the gas bubble is introduced into the liquid via the inlet. The microfluidic device may comprise a plurality of inlets. For example, the microfluidic device may comprise a liquid inlet, wherein the liquid is received into the microfluidic chamber via the liquid inlet, and a body inlet, wherein the body is introduced into the liquid via the body inlet. For example, the microfluidic device may comprise a liquid inlet, wherein the liquid is received into the microfluidic chamber via the liquid inlet, and a gas inlet, wherein a gas bubble is introduced into the liquid via the gas inlet. For example, the microfluidic device may comprise a first liquid inlet, wherein a first liquid component of the liquid is received into the microfluidic chamber via the first liquid inlet, a second liquid inlet, wherein a second liquid component of the liquid is received into the microfluidic chamber via the second liquid inlet and, optionally, a gas inlet. The inlet may be arranged to control introduction of the body into the liquid. The inlet may be arranged to form, create or generate the body. For example, if the body is a gas bubble, the inlet may be arranged to create the gas bubble, such as from a gas in fluid communication with the inlet. For example, the inlet may comprise a gas nozzle. A shape and/or size of the inlet may be arranged to control introduction of the body into the liquid. For example, the inlet may comprise a round shape, suitable for generating a gas bubble. For example, the inlet may comprise a size suitable for generating a gas bubble having a required size, such as a diameter or width D. For example, a ratio of a cross-sectional area of the inlet to a cross-sectional area of the microfluidic chamber proximal the inlet may be at least 1:1, at least 1:2, at least 1:5, at least 1:10, at least 1:20, at least 1:50 or at least 1:100. There may be a critical gas velocity $U_b=2\times10^{-3}$ m·s-1 at which bubbling occurs and another critical gas velocity $U_s=5\times10^{-2}$ m·s$^{-1}$ at which the bubbling behaviour gives way to a slug behaviour enabling the displacement of the liquid in the microfluidic chamber. For mixing, the gas velocity is preferably in the range from $U_b$ to $U_s$. For transfer of the liquid by displacement from the microfluidic chamber, the gas velocity is preferably at least $U_s$. Bubble size may depend on gas flow rate $U_b$, gas-liquid-wall surface tension, fluid viscosity/density and inlet geometry (angle $\beta$).

The microfluidic device may comprise an outlet. The outlet may comprise a perforation or passageway through a wall of the microfluidic chamber. The liquid and/or the body may exit the microfluidic device via the outlet. The inlet may be arranged proximal one end of the microfluidic chamber and the outlet may be arranged proximal another end, for example a distal end and/or an opposed end, of the microfluidic chamber. The inlet may comprise the outlet. That is, the liquid may be received into the microfluidic chamber via the inlet and the liquid may also exit the microfluidic chamber via the inlet, i.e. which then acts as an outlet. The device may comprise more than one outlet. For example multiple outlets may be closed and open in concert to direct flow towards different outlets. In another scenario multiple outlets might be open at the same time. For example multiple outlets may be used to separate portion of fluids with different densities. In an example embodiment, the outlet is in fluid communication with the inlet via the microfluidic chamber.

The microfluidic chamber may comprise a channel, a passageway or a lumen, arranged to receive the liquid therein. The microfluidic chamber may have a dimension, for example a diameter or a width or an effective diameter or an effective width, of less than 3000 µm, less than 2000 µm, less than 1000 µm, less than 500 µm, less than 250 µm or less than 100 µm. The microfluidic chamber may have an aspect ratio (i.e. a ratio of length or effective length to diameter or effective diameter or width or effective width) of at least 10, at least 20, at least 50, at least 100, at least 200, at least 500, at least 1000. The microfluidic chamber may have a volume (i.e. an internal volume for receiving the liquid) of less than 10 µl, less than 20 µl, less than 50 µl, less than 100 µl, less than 200 µl, less than 500 µl or less than 1000 µl. A cross-section of the microfluidic chamber may comprise curved sides, for example only curved sides such as a circular or an oval cross-section. A cross-section of the microfluidic chamber may comprise straight sides, for example a polygonal, a square or a rectangular cross-section. A cross-section of the microfluidic chamber may comprise both curved sides and straight sides. A cross-section of the microfluidic chamber may be constant along a length of the microfluidic chamber. For example, microfluidic chamber may be tubular or substantially tubular. Alternatively, a cross-section of the microfluidic chamber may be non-constant along a length of the microfluidic chamber. For example, a shape of the cross-section of the microfluidic chamber may be constant along a length of the microfluidic chamber while a size of the cross-section of the microfluidic chamber may be non-constant along a length of the microfluidic chamber. For example, the size of the cross-section of the microfluidic chamber may increase along the length of the microfluidic chamber, thereby affording expansion and/or reduction of back pressure, for example. Alternatively, the shape of the cross-section of the microfluidic chamber may be non-constant along the length of the microfluidic chamber while the size of the cross-section of the microfluidic chamber may be constant along a length of the microfluidic chamber. Alternatively, the shape and the size of the cross-section of the microfluidic chamber may be non-constant along the length of the microfluidic chamber.

The microfluidic chamber may comprise a wall. The wall may be arranged to, in part, control translation through the liquid of the body. The wall may comprise a plurality of wall portions, for example an upper or first wall portion opposed to a lower or second wall portion. The wall may further comprise opposed side wall portions, for example third and fourth wall portions, therebetween. A wall portion of the plurality of wall portions may be arranged to, in part, control translation through the liquid of the body. For example, the first wall portion may be arranged to, in part, control translation through the liquid of the body. For example, the first wall portion may be arranged to oppose, at least in part, a force on the body due to the potential field acting on the body. For example, the first wall portion may be arranged transversally to a direction of the force on the body due to the potential field acting on the body. For example, the first wall portion may inhibit or reduce movement or a speed of movement of the body through the liquid due to the potential field acting on the body. For example, if the potential field is a gravitational potential field and the body is a gas bubble, the first wall portion may be arranged transversally with respect to the gravitational potential field and thereby inhibit or hinder ascension of the gas bubble through the liquid. The first wall portion may be inclined or tilted with respect to the second side wall portion. That is, the first and second wall portions may not be parallel. For example, if the potential field is a gravitational potential field and the body is a gas bubble, the first wall portion may be arranged inclined with respect to the gravitational potential field such that the gas bubble moves along the first wall portion through the liquid. That is, the first wall portion provides a tilted ceiling for the microfluidic chamber. An angle of inclination a of the first wall portion with respect to the second wall portion may be constant along a length, or a substantial length, of the microfluidic chamber. An angle of inclination a of the first wall portion with respect to the second wall portion may be non-constant along a length, or a substantial length, of the microfluidic chamber. For example, an angle of inclination a of the first wall portion with respect to the second wall portion may be at least 2°, at least 3°, at least 4° or at least 5°. For example, an angle of inclination a of the first wall portion with respect to the second wall portion may be in a range 0.5° to 50°, a range 2° to 40°, a range 3° to 45°, a range 0.5° to 90°, a range 2° to 90°, or a range 3° to 90°. An angle of inclination a of the first wall portion with respect to the second wall portion may be dependent on a width or diameter of the microfluidic chamber. For example, an angle of inclination a of the first wall portion with respect to the second wall portion may be inversely dependent on or inversely proportional to a width or diameter of the microfluidic chamber. For example, an angle of inclination a may be in a range 4° to 5° for a width of 2000 µm. For example, an angle of inclination a may be in a range 25° to 30° for a width of 200 µm. The wall may be arranged boustrophedonically. That is, the wall may be arranged in a zig-zag manner, alternately left to right then right to left, for example. In this way, an effective length of the microfluidic chamber may be increased for a given size or net length of the microfluidic chamber, thereby increasing an efficiency of mixing while increasing space utilization, for example of a cartridge comprising the microfluidic chamber. Such a boustrophedonic arrangement of the wall may provide relatively longer portions of the microfluidic chamber arranged transversally to and alternately with relatively shorter portions of the microfluidic chamber. The wall may be arranged spirally or helically, so as to similarly increase an efficiency of mixing for a given size or net length of the microfluidic chamber.

The microfluidic chamber may comprise no perforations or passageways, other than the inlet and the optional outlet. The microfluidic chamber may have an inner surface. The inner surface may be arranged to facilitate flow, for example laminar flow. For example, the inner surface may be smooth, thereby facilitating flow by reducing drag. The inner surface may be arranged to increase mixing, for example by promoting turbulent flow. For example, the inner surface may comprise one or more protrusions and/or recesses, thereby promoting turbulent flow and hence increasing mixing.

The microfluidic chamber may be arranged to reduce or avoid dead volumes, for example, by reducing or eliminating internal corners or recesses. Corners of the microfluidic chamber may be chamfered or radiused, to facilitate flow of the liquid and/or reduce or avoid dead volumes.

The microfluidic device may comprise a plurality of such microfluidic chambers. For example, the microfluidic device may comprise a first microfluidic chamber and at least a second microfluidic chamber, wherein the first microfluidic chamber and the second microfluidic chamber are fluidically coupled. For example, an outlet of the first microfluidic chamber may be fluidically coupled to the inlet of the second microfluidic chamber. The first microfluidic chamber and the second microfluidic chamber may be fluidically coupled via a syphon. The syphon may be arranged to prevent the liquid from the first microfluidic chamber transferring to the second microfluidic chamber or vice versa, for example even when hydrostatic heads of the liquids in the first microfluidic chamber and second microfluidic chamber are different. The syphon may be arranged to receive a gas. The gas received in the syphon may isolate liquids received in the first microfluidic chamber and the second microfluidic chamber. The syphon may be arranged to permit a gas from the first microfluidic chamber transferring to the second microfluidic chamber or vice versa. For example, if the body is a gas bubble, the gas bubble may be introduced into the liquid in the first microfluidic chamber, via the inlet thereof, translate through the liquid thereby mixing the liquid, exit the first microfluidic chamber via the outlet thereof and hence be introduced into the liquid in the second microfluidic chamber, via the inlet thereof. The syphon may be arranged to permit the liquid from the first microfluidic chamber transferring to the second microfluidic chamber or vice versa, for example due to an increased pressure applied to the liquid in the first microfluidic chamber via the inlet thereof. For example, by increasing a fluid pressure at the inlet of the first microfluidic chamber, the liquid received in the first microfluidic chamber may be transferred to the second microfluidic device.

The microfluidic device may be chemically and/or biologically inert. That is, the microfluidic device may be compatible with biological samples, for example. Alternatively, the microfluidic device may be chemically and/or biologically active and/or reactive. For example, the microfluidic device may react with biological samples. For example, the microfluidic device may comprise a catalyst. The microfluidic device may comprise a material having such properties. A wall of the microfluidic device may comprise such a material. An internal surface of the microfluidic device may comprise such a material. For example, the microfluidic device may comprise a polymeric composition comprising a polymer, a metal such as an alloy and/or a ceramic. For example, the microfluidic device may a polymeric composition comprising a polymer such as poly (methyl methacrylate) (PMMA). For example, the microfluidic device may comprise a metal such as a stainless steel such as 316 stainless steel. For example, the microfluidic device may comprise a ceramic such as silicon dioxide. An internal surface of the microfluidic device may comprise a coating of such a material.

The fifth aspect of the invention provides a microfluidic cartridge comprising a microfluidic device according to the fourth aspect. The microfluidic cartridge may be suitable for biological analysis of a biological sample and/or a biological liquid, as described previously. The microfluidic cartridge may comprise a plurality of microfluidic devices according to the fourth aspect. The plurality of microfluidic devices may be fluidically coupled. The microfluidic cartridge may comprise a filter, arranged to filter the liquid. The microfluidic cartridge may comprise a reservoir, arranged to hold a liquid component. The microfluidic cartridge may comprise a membrane, arranged to adsorb a part of the liquid. The microfluidic cartridge may comprise a valve connector. The microfluidic cartridge may comprise an inlet and/or an outlet. The microfluidic cartridge may comprise one or more passageways fluidically coupled to one or more of the microfluidic devices, such that, for example, one or more reagents may be received into the one or more of the microfluidic devices via the one or more passageways.

The sixth aspect of the invention provides an apparatus arranged to control a microfluidic device according to the fourth aspect or a microfluidic cartridge according to the fifth aspect. The apparatus may comprise a controller, one or more pumps or injectors, one or more valves, one or more heaters and/or one or more detectors. The controller may be arranged to control at least one of the one or more pumps, at least one of the one or more valves and/or at least one of the one or more detectors. The controller may be arranged to control a flow rate of the liquid into and/or through the microfluidic device and/or the microfluidic cartridge. For example, the controller may be arranged to control one of the one or more pumps or injectors to pump or inject the liquid into the microfluidic device and/or microfluidic cartridge at a flow rate of less than 0.1 µl/s, less than 1 µl/s, less than 5 µl/s or less than 10 µl/s, for example about 2.8 µl/s. The controller may be arranged to control a flow rate of a gas into and/or through the microfluidic device and/or microfluidic cartridge. For example the controller may be arranged to control one of the one or more pumps or injectors to pump or inject the gas into the microfluidic device and/or microfluidic cartridge at a flow rate of less than 1 µl/s, less than 1 µl/s, less than 5 µl/s, less than 10 µl/s, less than 100 µl/s, or less than 200 µl/s or less than 500 µl/s or less than 1000 µl/s for example about 28 µl/s or about 169 µl/s. In this way, the microfluidic device may provide gas bubbles from the gas. For example the controller may be arranged to control one of the one or more pumps or injectors to pump or inject the gas into the microfluidic device and/or microfluidic cartridge at a flow rate of more than 10 µl/s, more than 20 µl/s, more than 50 µl/s, more than 100 µl/s, more than 200 µl/s, more than 500 µl/s or more than 1000 µl/s, for example about 153 µl/s. In this way, the microfluidic device may provide a gas buffer for transferring the liquid between microfluidic chambers.

The seventh aspect of the invention provides a microfluidic system comprising an apparatus according to the sixth aspect and a microfluidic device according to the fourth aspect or a microfluidic cartridge according to the fifth aspect.

The eighth aspect of the invention provides a method of operating a microfluidic system according to the seventh aspect.

BRIEF DESCRIPTION OF THE FIGURES

For a better understanding of the invention, and to show how exemplary embodiments of the same may be brought into effect, reference will be made, by way of example only, to the accompanying diagrammatic Figures, in which.

DETAILED DESCRIPTION OF VARIOUS EMBODIMENTS

Figure 1:
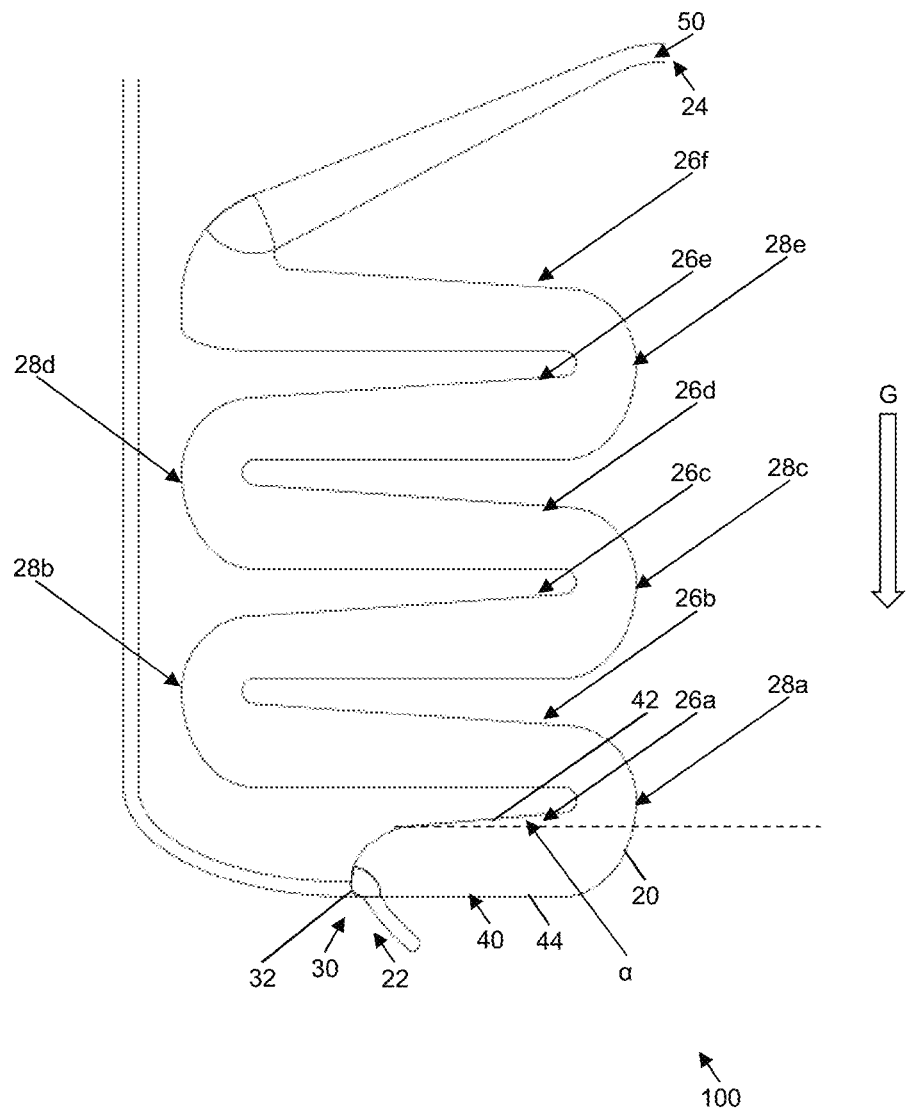
FIG. 1 schematically depicts a front cross-sectional view of a microfluidic device according to an exemplary embodiment of the invention.

FIG. 1 schematically depicts a microfluidic device 100 according to an exemplary embodiment of the invention. The microfluidic device 100 comprises a microfluidic chamber (also known as a channel) 20, having an inlet 30, and arranged to receive a liquid (not shown) therein. In use, the microfluidic device 100 is arranged to control translation through the liquid of a body (not shown) introduced therein via the inlet 30, wherein the translation of the body is due to a potential field G acting on the body. In use, the controlled translation of the body mixes the liquid.

The microfluidic chamber 20 has a volume of 300 μl and a width of 2000 μm. The microfluidic chamber 20 is substantially tubular and has an aspect ratio of about 3. An internal cross-section of the microfluidic chamber 20 is substantially rectangular, having straight sides and radiused internal corners between the sides. The internal cross-section of the microfluidic chamber 20 is non-constant along a length L of the microfluidic chamber 20. The shape of the internal cross-section of the microfluidic chamber 20 is substantially constant along the length L of the microfluidic chamber 20 while a size of the internal cross-section of the microfluidic chamber is non-constant along the length L of the microfluidic chamber 20. The size of the internal cross-section of the microfluidic chamber 20 successively increases and then decreases along the length L of the microfluidic chamber 20. This particular shape allows for the effective use of bubbles for the mixing and at the same time the complete emptying of the liquid contained within the chamber with a slug-flow, generated at airflow rates compatible with microfluidic devices.

The microfluidic chamber 20 comprises a wall 40 arranged to, in part, control translation through the liquid of the body, in use. The wall 40 comprises an upper or first wall portion 42 opposed to a lower or second wall portion 44. The first wall portion 42 is arranged to, in part, control translation through the liquid of the body, in use. The first wall portion 42 is arranged transversally with respect to the gravitational potential field G and thereby inhibits or hinders ascension of the body through the liquid. The first wall portion 42 is inclined or tilted with respect to the second side wall portion 44 by an angle of inclination a in a range 4° to 5°. The wall 40 is arranged boustrophedonically (i.e. in a zig-zag manner, alternately left to right then right to left). The boustrophedonic arrangement of the wall 40 provides six (6) relatively longer portions 26 (26a-26f) of the microfluidic chamber 20 arranged transversally to and alternately with five (5) relatively shorter portions 28 (28a-28e) of the microfluidic chamber. The wall 40 is arranged to reduce or avoid dead volumes, for example, by reducing or eliminating internal corners or recesses. An inner surface of the wall 40 is smooth, thereby facilitating flow by reducing drag.

The inlet 30 is arranged to control introduction of the body into the liquid. The inlet 30 is arranged to form, create or generate the body. The inlet 30 comprises a gas nozzle 32 arranged to generate a gas bubble. A ratio of a cross-sectional area of the gas nozzle 32 to a cross-sectional area of the microfluidic chamber 20 proximal the inlet 30 is about 1:5.

The microfluidic device 100 comprises an outlet 50. The inlet 30 is arranged proximal one end 22 of the microfluidic chamber 20 and the outlet 50 is arranged proximal an opposed end 24 of the microfluidic chamber 20. The inlet 30 and the outlet 50 each comprise a passageway through the wall 40 of the microfluidic chamber 20. The wall 40 comprises no other passageways therethrough.

The microfluidic device 100 is manufactured from poly (methyl methacrylate) (PMMA).

Figure 2:
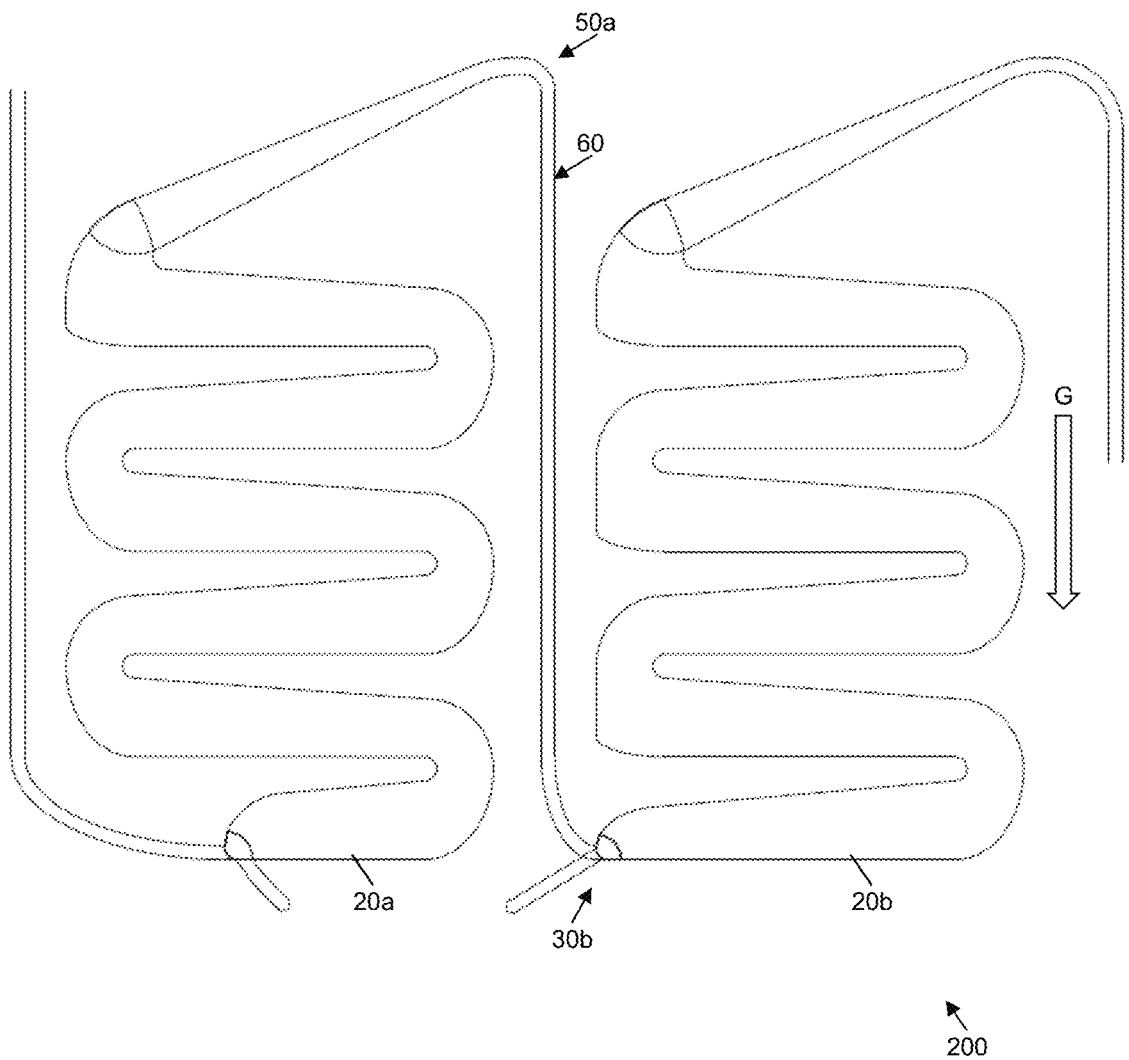
FIG. 2 schematically depicts a front cross-sectional view of another microfluidic device according to an exemplary embodiment of the invention.

FIG. 2 schematically depicts another microfluidic device 200 according to an exemplary embodiment of the invention. The microfluidic device 200 comprises two (2) (i.e. a plurality) of microfluidic chambers 20 (20a-20b), generally as described above with respect to the microfluidic device 100. Like reference signs denote like features, the reference signs suffixed consistently with the respective microfluidic chambers 20 (20a-20b).

The microfluidic device 200 comprises the first microfluidic chamber 20a and the second microfluidic chamber 20b, wherein the outlet 50a of the first microfluidic chamber 20a is fluidically coupled to the inlet 30b of the second microfluidic chamber 20b via a syphon 60.

Figure 3:
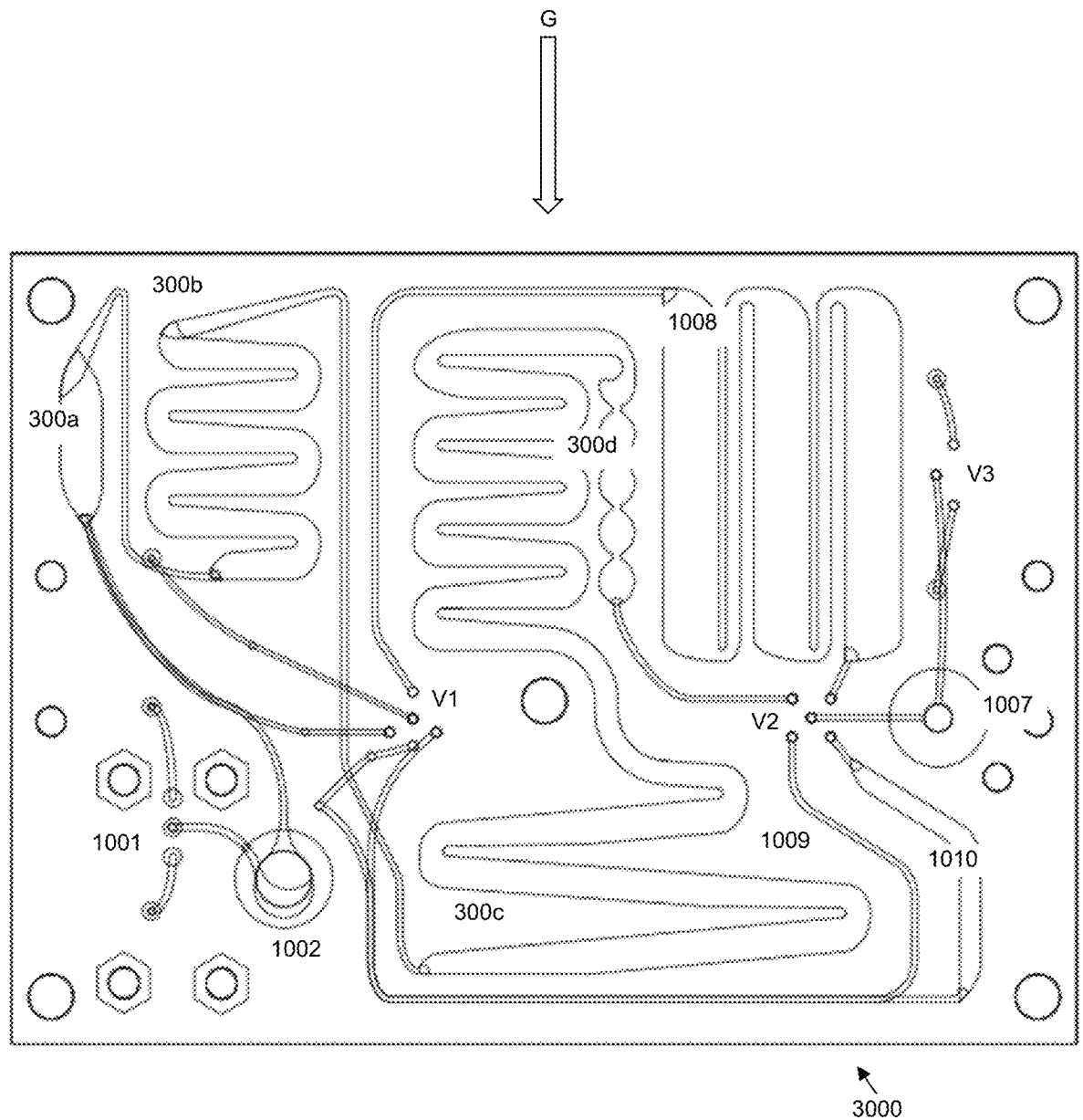
FIG. 3 schematically depicts schematically depicts a microfluidic cartridge according to an exemplary embodiment of the invention.

FIG. 3 schematically depicts schematically depicts a microfluidic cartridge 3000 according to an exemplary embodiment of the invention. The microfluidic cartridge 1000 comprises four (4) (i.e. a plurality) of fluidically-coupled microfluidic devices 300 (300a-300d). The first microfluidic device 300a provides a Proteinase K chamber (100 μl max) having an angle of inclination a of 90°, the second microfluidic device 300b provides a lyse buffer chamber (300 μl max) having an angle of inclination a in a range 4° to 5°, the third microfluidic device 300c provides a chaotropic agent chamber (1000 μl max) having an angle of inclination a in a range 4° to 5° and the fourth microfluidic device 300d provides a mixing structure, having an angle of inclination a in a range 4° to 5°. The microfluidic cartridge 1000 also comprises a cartridge inlet (Blood Plasma Separation Chip connector) 1001, a filter (RBC filter zone) 1002, an adsorption membrane (nucleic acids adsorption membrane) 1007, a second reservoir 1008 (washing buffer chamber, 700 μl max), a third reservoir (drying air channel) 1009, a fourth reservoir (elution buffer chamber, 65 μl max) 1010, three (3) valves V1-V3 and a cartridge outlet (not shown). These components of the microfluidic cartridge 1000 are fluidically coupled so as to provide a fluid pathway between the cartridge inlet 1001 and the cartridge outlet via one or more of these components.

Figure 4:
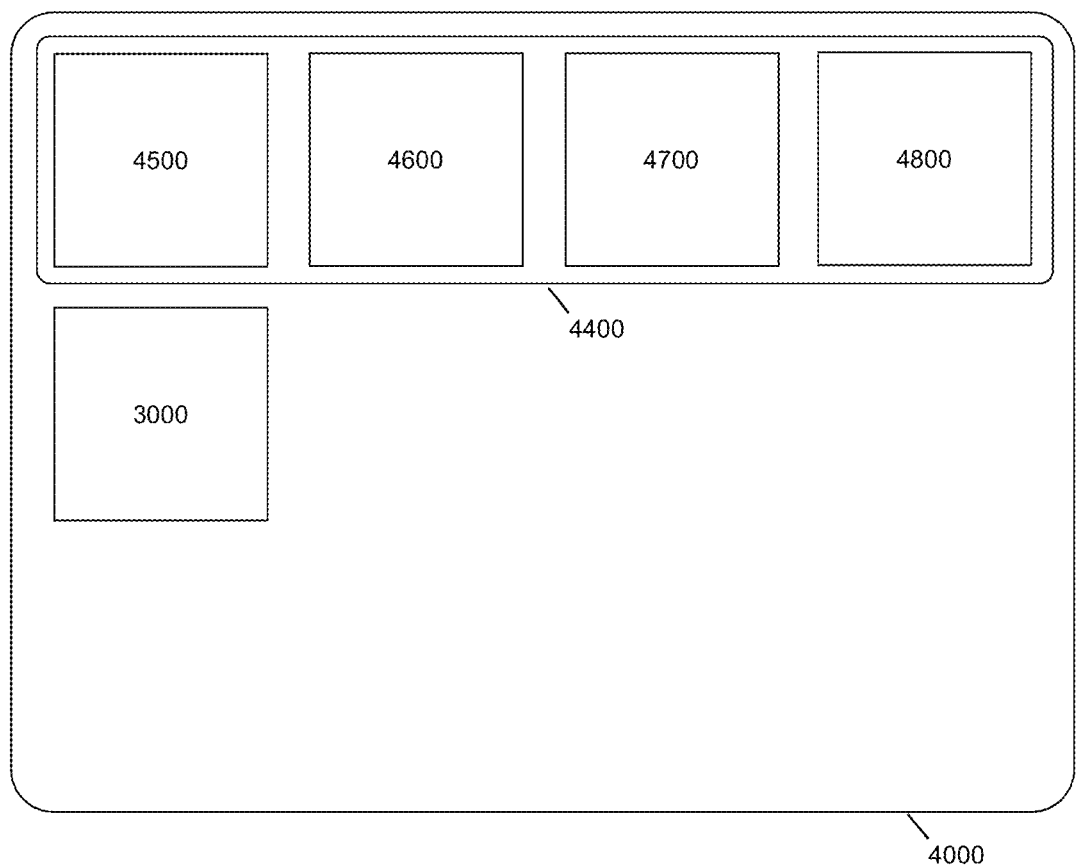
FIG. 4 schematically depicts a microfluidic system according to an exemplary embodiment of the invention.

FIG. 4 schematically depicts a microfluidic system 4000 according to an exemplary embodiment of the invention. The microfluidic system 4000 comprises an apparatus 4400 arranged to control the microfluidic cartridge 3000 and the microfluidic cartridge 3000. The apparatus 4400 comprises a controller 4500, a syringe pump 4600, a valve 4700 and a heater 4800. The controller 4500 is arranged to control the syringe pump 4600, the valve 4700 and the heater 4800. The controller 4400 is arranged to control a flow rate of the liquid and a gas into and/or through the microfluidic cartridge 3000.

Figure 5:
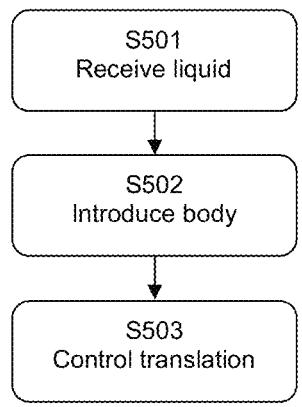
FIG. 5 schematically depicts a process of mixing of a liquid according to an exemplary embodiment of the invention.

FIG. 5 schematically depicts a process of mixing of a liquid according to an exemplary embodiment of the invention. Particularly, the process of mixing a liquid is by controlling translation of a body therethrough.

At S501, a liquid is received in a microfluidic device.

At S502, a body is introduced into the liquid.

At S503, translation of the body through the liquid is controlled, wherein the translation of the body is due to a potential field acting on the body. The controlled translation of the body mixes the liquid.

Figure 6:
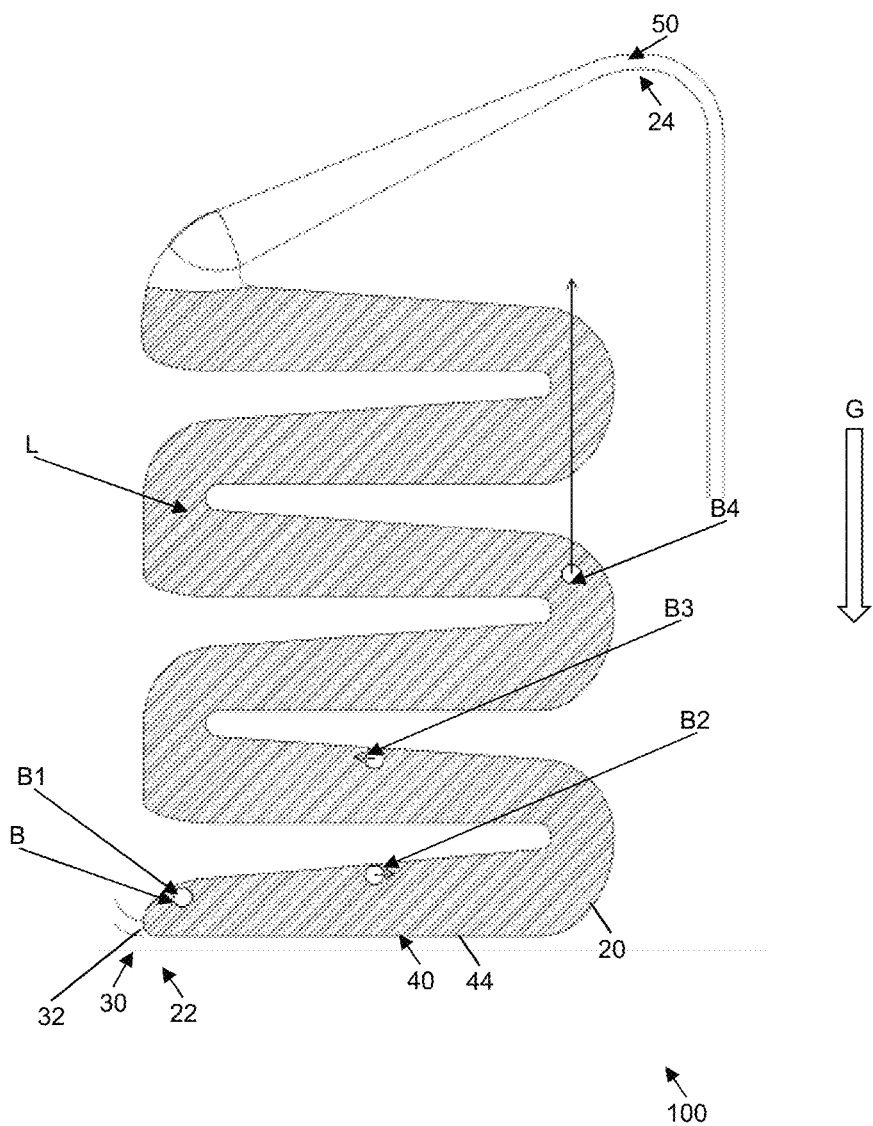
FIG. 6 schematically depicts a front cross-sectional view of the microfluidic device of FIG. 1, in use.

FIG. 6 schematically depicts the microfluidic device of FIG. 1, in use. The microfluidic device 100 comprises the microfluidic chamber (also known as channel) 20, having the inlet 30, and arranged to receive the liquid L therein. In use, the microfluidic device 100 is arranged to control translation through the liquid L of the body B introduced therein via the inlet 30, wherein the translation of the body B is due to the potential field G acting on the body B. The body B is a gas bubble B. FIG. 6 schematically depicts the bubble B at successive time intervals, denoted as B1-B4, thereby schematically depicting translation of the bubble B through the liquid L. The gas bubble B is formed by the inlet 30. The first wall portion 42 is arranged transversally with respect to the gravitational potential field G and thereby inhibits or hinders ascension of the gas bubble B through the liquid L, from the inlet 30 towards the outlet 50. The gas bubble B moves along the first wall portion 42 through the liquid L. In this way, the controlled translation of the body B mixes the liquid L.

Figure 7:
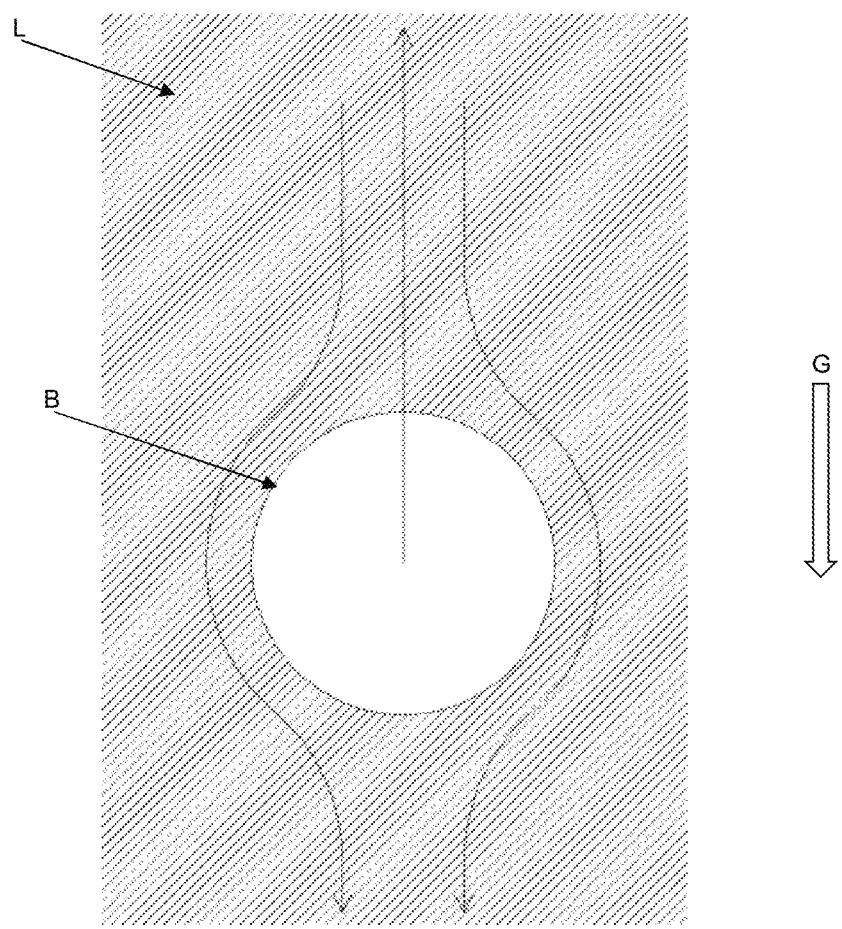
FIG. 7 schematically depicts a front cross-sectional view of translation of a body through a liquid.

FIG. 7 schematically depicts translation of the gas bubble B through the liquid L. A rise or ascension velocity of the gas bubble B is dependent on a bubble equivalent diameter, characteristics of gas/liquid systems, such as density, viscosity and/or surface tension, operating parameters such as temperature, pressure and/or gravity and liquid motion. Mixing of the liquid L is provided by fluid backmixing due to displacement of the liquid L during rising of the gas bubble B.

Figure 8:
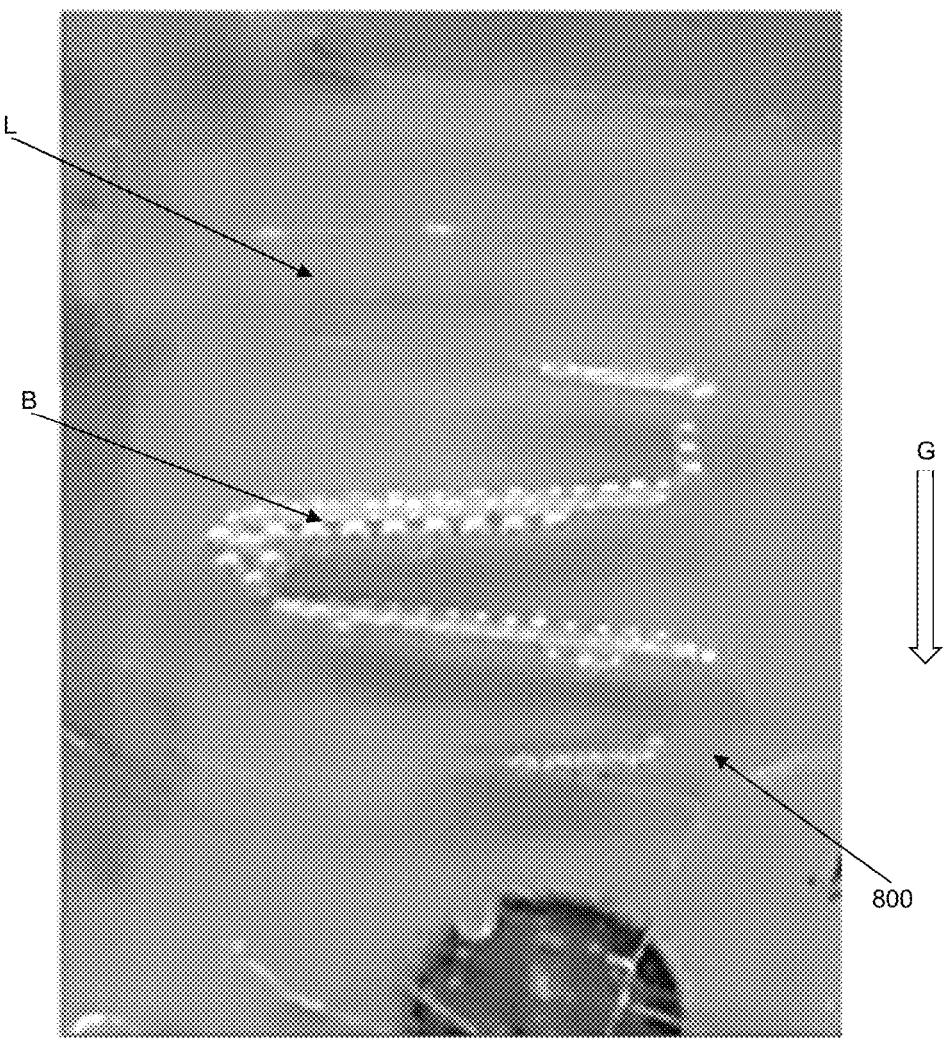
FIG. 8 schematically depicts a front elevation view of yet another microfluidic device according to an exemplary embodiment of the invention, in use.

FIG. 8 schematically depicts yet another microfluidic device 800 according to an exemplary embodiment of the invention, in use. The microfluidic device 800 is generally as described above with respect to the microfluidic device 100. Like reference signs denote like features. In use, the microfluidic device 800 is generally as described above with reference to FIG. 6. In use, the microfluidic device 800 is arranged to control translation through the liquid L of a plurality of bodies B (B1-Bn) introduced therein via the inlet 30, wherein the translation of the bodies B is due to the potential field G acting on the body. The bodies B are gas bubbles B. When a gas flow rate is low (<1 μl/s) gas contained in dead volumes in the microfluidic device 800 forms some of the gas bubbles B, which rise towards the top of the microfluidic chamber 820. When the gas flow rate is high (>28 μl/s), the gas may push the liquid L contained in the microfluidic chamber out of the outlet 850. In this way, the liquid may be transferred to another chamber, for example, another microfluidic device.

Figure 9:
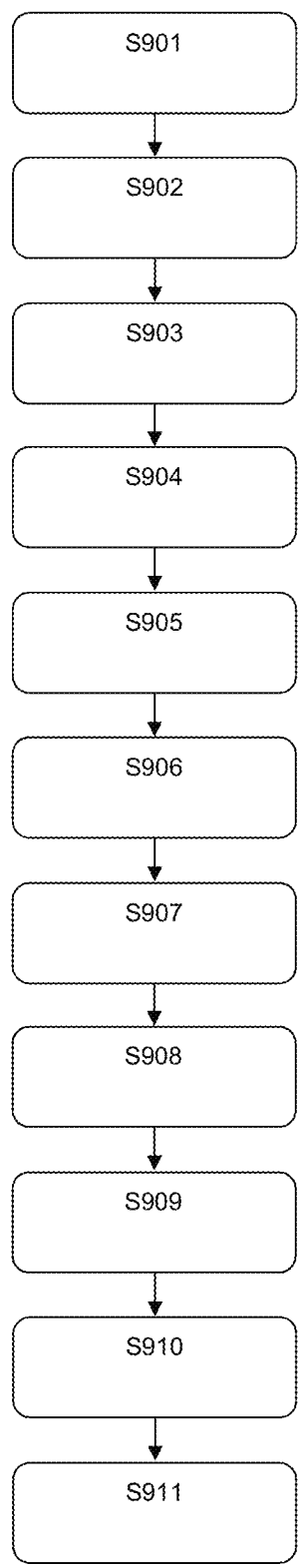
FIG. 9 schematically depicts a process of operating the microfluidic system of FIG. 4.

FIG. 9 schematically depicts a process of operating the microfluidic system of FIG. 4.

At S901, Inlet sample enters the cartridge with a flow rate of 10 ml/hr and it is processed through the blood plasma separation (BPS) microfluidic structures. The stream is divided, by hydrodynamic separation, in a red blood cells enriched stream and a virtually cell free plasma stream. RBC enriched stream goes to waste while the plasma stream goes on to the downprocessing steps within the automated cartridge.

At S902, a filter eliminates the residual red and white blood cells that might escape the hydraulic separation, avoiding PCR inhibition and genomic contamination of the sample.

At S903, purified plasma mixes with Proteinase K in the first chamber. The air present within the channels, displaced by the fluid, creates bubbles that rise to the free surface and are pushed to the next chamber. Proteinase K digests proteins, such as nuclease, that would degrade the nucleic acids in the sample.

At S904, as the syringe pump pushes fresh sample through the BPS, the fluid which filled chamber 3 is pushed to the next chamber where mixes with the lyse buffer. In this step nucleic acids are released from microvesicles and from protein complexes they are bound to.

At S905, the sample finally mixes with the chaotropic agent. This step changes the stability of the solution and creates the conditions for the bonding of the nucleic acids on the silica membrane.

At S906, once the whole inlet sample is processed, air is pushed inside the cartridge at 100 ml/hr through a chamber filled with chaotropic agent and directly connected to the plasma lines, straight after the filtering zone. The bubble stream that is produced enhances mixing of sample and reagents. The presence of chaotropic agent in the first and last chamber ensure that adsorption conditions are fulfilled during the whole extraction.

At S908, mixing structures delay the exit of fluid and enhance sample uniformity. These structures include enlargements and constrictions along the section, to create velocity gradients and whirls in the fluid, plus a backmixing effect due to the different time fillets of fluid will employ to cross them.

At S908, increasing the air flow rate to 550 ml/hr produces larger bubbles and successfully pushes the entirety of the fluid through the adsorption membrane. After nucleic acids adsorption the sample leaves the cartridge through a waste channel.

At S909, turning valves (v) switches fluidic connections within the cartridge. Air can now be used to push a washing buffer through the membrane. Air flow rate ranges from 100 to 550 ml/hr to ensure the thorough emptying of the reagent chamber. This process removes proteins and other impurities that can be adsorbed on the membrane and that would contaminate the sample and inhibit amplification.

At S910, the membrane is then dried for 5 minutes through air flow with alternate direction at 550 ml/hr. To ease the drying, the area above the membrane is heated to 50° C. by mean of an electric heater and thermal controller. The heater is integrated in the electric module that controls the stepper motors that turns the valves and the syringe pumps. An effective drying removes all the chaotropic agent, allowing for a more effective sample elution.

At S911, after drying, valves are turned again, switching the fluidic path within the cartridge. An air flow of 10 ml/hr ensures the slow and effective elution of the nucleic acids from the membrane in 65 ml of elution buffer. The cfNAs elution is collected in a fresh tube through a clean channel specifically opened with the valves rotation. The whole protocol takes about 40 minutes when starting from 5 ml of whole blood and does not require trained staff to assist the automated platform during the extraction. In contrast, conventional protocols take about 1.5-2 hours and may require trained staff.

Although a preferred embodiment has been shown and described, it will be appreciated by those skilled in the art that various changes and modifications might be made without departing from the scope of the invention, as defined in the appended claims and as described above.

In summary, the invention provides a microfluidic device for mixing a liquid, for example inline mixing of a liquid and/or mixing of liquids. The microfluidic device comprises a microfluidic chamber, having an inlet, and arranged to receive the liquid therein. In use, the microfluidic device is arranged to control translation through the liquid of a body introduced therein, wherein the translation of the body is due to a potential field acting on the body. In this way, the controlled translation of the body mixes the liquid in the microfluidic chamber.

Attention is directed to all papers and documents which are filed concurrently with or previous to this specification in connection with this application and which are open to public inspection with this specification, and the contents of all such papers and documents are incorporated herein by reference.

All of the features disclosed in this specification (including any accompanying claims and drawings), and/or all of the steps of any method or process so disclosed, may be combined in any combination, except combinations where at least some of such features and/or steps are mutually exclusive.

Each feature disclosed in this specification (including any accompanying claims, and drawings) may be replaced by alternative features serving the same, equivalent or similar purpose, unless expressly stated otherwise. Thus, unless expressly stated otherwise, each feature disclosed is one example only of a generic series of equivalent or similar features.

The invention is not restricted to the details of the foregoing embodiment(s). The invention extends to any novel one, or any novel combination, of the features disclosed in this specification (including any accompanying claims and drawings), or to any novel one, or any novel combination, of the steps of any method or process so disclosed.

The invention claimed is:

1. A microfluidic device comprising:
a microfluidic chamber having an inlet comprising a gas nozzle for generating gas bubbles; and
a wall portion;
wherein:
the microfluidic chamber is configured to receive a liquid therein;
the microfluidic device is configured, in use, to control translation through the liquid of a gas bubble introduced therein via the inlet and generated by the gas nozzle, the translation of the gas bubble being due to a gravitational potential field acting on the gas bubble, the translation of the gas bubble through the liquid being due, in part, to a difference between a density of the gas bubble and a density of the liquid; and
the wall portion is configured to, in part, control translation through the liquid of the gas bubble, whereby the controlled translation of the gas bubble mixes the liquid by fluid back-mixing due to displacement of the liquid during ascension of the gas bubble.

2. The microfluidic device according to claim 1, wherein the wall portion is arranged transversally to a direction of a force on the gas bubble due to the gravitational potential field acting on the gas bubble.

3. The microfluidic device according to claim 2, wherein the wall portion is arranged at an angle of inclination a relative to the direction of the force on the gas bubble, wherein the angle of inclination a is in a range 3° to 90°.

4. The microfluidic device according to claim 1, wherein the wall portion is arranged boustrophedonically.

5. The microfluidic device according to claim 1, wherein the microfluidic device comprises a plurality of microfluidic chambers.

6. A microfluidic cartridge comprising a microfluidic device according to claim 1.

7. The microfluidic device according to claim 1, wherein the translation of the gas bubble through the liquid is controlled at least in part by the interaction between the gas bubble and the microfluidic device.

8. The microfluidic device according to claim 1, wherein acceleration of the gas bubble during the ascension is opposed by interaction between the gas bubble and a surface of the microfluidic device.

9. The microfluidic device according to claim 1, wherein the microfluidic device is configured, in use, to control ascension of the gas bubble through the liquid.

10. A process of mixing a liquid in a microfluidic device by controlling translation of a gas bubble therethrough, the method comprising the steps of:
receiving a liquid in the microfluidic chamber;
generating a gas bubble and introducing the gas bubble into the liquid; and
controlling translation of the gas bubble through the liquid, wherein the translation of the gas bubble is due to a gravitational potential field acting on the gas bubble, the translation of the gas bubble through the liquid being due, in part, to a difference between a density of the gas bubble and a density of the liquid;
whereby the controlled translation of the gas bubble mixes the liquid by fluid back-mixing due to displacement of the liquid during ascension of the gas bubble.

11. The process according to claim 10, wherein the controlling translation of the body through the liquid comprises controlling ascension of the gas bubble through the liquid.

12. The process according to claim 11, further comprising the step of generating a plurality of gas bubbles.

13. The process according to claim 12, further comprising the step of controlling a rate of generating the plurality of gas bubbles.

* * * * *